United States Patent [19]

Miyagaki et al.

[11] 4,266,239
[45] May 5, 1981

[54] SEMICONDUCTOR DEVICE HAVING IMPROVED HIGH FREQUENCY CHARACTERISTICS

[75] Inventors: Katsunori Miyagaki; Shozo Noguchi; Yukio Hirakawa, all of Tokyo, Japan

[73] Assignee: Nippon Electric Co., Ltd., Tokyo, Japan

[21] Appl. No.: 957,144

[22] Filed: Nov. 3, 1978

Related U.S. Application Data

[63] Continuation of Ser. No. 783,743, Apr. 1, 1977, abandoned.

[30] Foreign Application Priority Data

Apr. 5, 1976 [JP] Japan .................................. 51-38060

[51] Int. Cl.³ .................... H01L 25/04; H01L 29/34; H01L 29/40
[52] U.S. Cl. ........................................ 357/84; 357/52; 357/53; 357/72; 357/80
[58] Field of Search ..................... 357/80, 81, 74, 84, 357/53, 72, 52

[56] References Cited

U.S. PATENT DOCUMENTS

| 3,257,588 | 6/1966 | Mueller | 357/84 |
| 3,436,612 | 4/1969 | Grosvalet | 357/53 |
| 3,489,953 | 1/1970 | Thomas | 357/53 |
| 3,518,494 | 6/1970 | James | 357/84 |
| 3,518,504 | 6/1970 | Dietrich | 357/84 |
| 3,555,375 | 1/1971 | Hilbers | 357/74 |
| 3,588,741 | 6/1971 | Glance | 357/74 |
| 3,614,546 | 10/1971 | Avins | 357/84 |
| 3,617,817 | 11/1971 | Kawakatsu | 357/84 |
| 3,838,443 | 9/1974 | Laighton | 357/84 |
| 4,092,664 | 5/1978 | Davis | 357/80 |
| 4,107,555 | 8/1978 | Haas et al. | 357/84 |
| 4,177,480 | 12/1979 | Hintzmann | 357/72 |

FOREIGN PATENT DOCUMENTS 1204805  9/1970  United Kingdom ...................... 357/53

OTHER PUBLICATIONS

RCA Technical Notes; Radiation Shielding of Electronic Components; by Schenk et al., Tn. No. 1120, Jun., 1975.

Primary Examiner—Andrew J. James
Attorney, Agent, or Firm—Hopgood, Calimafde, Kalil, Blaustein & Lieberman

[57] ABSTRACT

A semiconductor device in which a conducting shielding member is disposed over the space between the input and output terminal metal layers and over the semiconductor chip bonded to the output metal layer. The shielding member is electrically connected to the common terminal metal layer. This construction results in a reduction in the storage capacitance between the input and output terminal layers and improved power gain and stability of operation, particularly at high frequencies.

12 Claims, 4 Drawing Figures

SEMICONDUCTOR DEVICE HAVING IMPROVED HIGH FREQUENCY CHARACTERISTICS

This is a continuation of Ser. No. 783,743 filed Apr. 1, 1977 abandoned.

This invention relates generally, to semiconductor devices, and more particularly to a semiconductor device for use in the high frequency band which has an improved power gain and which is capable of stable operation.

Power gain is an important index of the performance of a semiconductor device for use in the high-frequency band, especially of a power transistor for use in this band. As is well known, the power gain of a transistor largely depends on the inductance in the path from the common electrode of the semiconductor chip, such as the emitter of a transistor, to the common lead of the package. To reduce this inductance, prior art semiconductor devices make use of two or more common terminals on an insulator substrate on which the semiconductor chip is bonded. For further reduction of this inductance, it has been also proposed to attach a bridge conductor to short circuit these common terminals and to connect the common electrode thereto by short wires, as described in "Electronics" May 26, 1969 pages 84 to 90, and "Semiconductor News Briefs" page 6 contained in "Electronics" Oct. 28, 1968.

Another factor which governs the performance of a semiconductor device at high frequencies, in addition to the inductance at the common electrode lead-out path, is the stray capacitance between the input and output leads of the semiconductor device, which capacitance causes input and output signals to interact with each other. More particularly, an increase in stray capacitance results in the feedback of the output signal to the input signal or in leakage of the input power directly to the output side, thereby lowering the power gain and making for unstable operation. As a result of these drawbacks, the stray capacitance between the portions of the input and output leads located on an insulator substrate on which a semiconductor chip is bonded should be minimized. However, the prior art semiconductor devices do not consider the positive minimization of the stray capacitance between the input and output terminals on the insulator substrate and, thus fail to achieve the desired power gain.

It is accordingly a principal object of the present invention to provide a semiconductor device which allows the input and output signals to be free of interaction and which provides a large power gain.

According to the present invention, there is provided a semiconductor device which comprises an insulator substrate and a first metal layer formed on the insulator substrate for receiving an input signal. A second metal layer is formed on the insulator substrate for feeding an output signal therefrom, and at least one third metal layer is formed on the insulator substrate for providing a fixed potential. A semiconductor chip is bonded to the second metal layer and has an input electrode, an output electrode, and a common electrode. The input, output and common electrodes are connected to the first metal layer, second metal layer, and third metal layers, respectively, and a shielding conductive member covers at least the semiconductor chip and the smallest space between the first and second metal layers. The said shielding conductive member has a fixed potential applied to the third metal layer.

According to the present invention, radiation electric fields from the first and second metal layers are shielded by the shielding conductive member in the neighborhood of the semiconductor chip, so that the effective stray capacitance between the first metal layer and the second metal layer is minimized. As a result, the input signal and the output signal can be separated, thereby preventing the feedback of the output signal to the input signal and the leakage of the input power to the output side, with the resulting improvements in power gain and stable operation of the semiconductor device. The semiconductor device according to the present invention effectively prevents the interaction between the input and output signals even in the high frequency band and is, therefore, highly suitable for use in the high-frequency band.

The above and other objects and features of the invention will become apparent from the following description considered in conjuction with the accompanying drawings; wherein.

Figure 1:
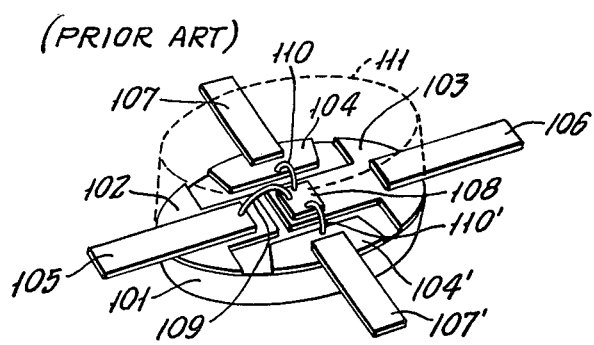
FIG. 1 is a perspective view of a prior art semiconductor device for high-frequency use.

Referring to the prior art semiconductor device illustrated in FIG. 1, an input-terminal metallized layer 102 and an output-terminal metallized layer 103 are laid on an insulator substrate 101 made of beryllia, alumina or the like in opposed relation to each other, while common-terminal metallized layers 104 and 104' formed also on the insulator substrate 101 are positioned in opposed relation to each other but on the opposite sides of the input-terminal metallized layer 102 and output-terminal metallized layer 103, respectively. An input lead 105 and an output lead 106 are bonded to the input-terminal metallized layer 102 and output terminal metallized layer 103, respectively, and common leads 107, 107' are bonded to the common terminal metallized layers 104, 104' in opposed relation to each other. A semiconductor chip 108 which may be a transistor, an integrated circuit or the like is bonded to the output-terminal metallized layer 103. The input electrode or base electrode of the semiconductor chip 108 is connected to the input-terminal metallized layer 102 by a bonding wire 109, and the common electrode is connected or the emitter electrode to the common-terminal metallized layers 104, 104' by bonding wires 110 and 110'. The components on the insulator substrate 101 including the semiconductor chip 108, the bonding wires 109, 110 and 110', and the metallized layers 102, 103, 104, and 104' are hermetically sealed with a sealing member 111 such as resin molded, or ceramic package, or the like.

With the aforesaid arrangement, the bonding wires 110 and 110' cannot be made sufficiently short, causing excessive inductance, and electrostatic shielding is not provided between the input and output-terminal metallized layers 102 and 103, thus impairing the power gain and stable opeation of the device to a large extent.

Figure 2:
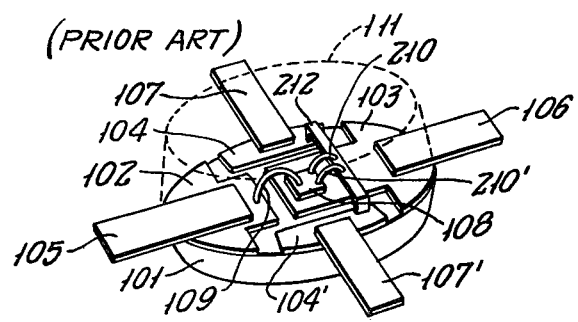
FIG. 2 is a perspective view showing another prior art semiconductor device.

Referring to the semiconductor device shown in FIG. 2, the common-terminal metallized layers 104 and 104' are shortcircuited by a bridge conductor 212 which spans over the output-terminal metallized layer 103, while the common electrode of the semiconductor chip 108 is connected to the bridge conductor 212 by short bonding wires 210 and 210'. Other parts of the device of FIG. 2 similar to those in the above-mentioned prior art semiconductor device in FIG. 1 and are designated by similar reference numerals.

As compared with the prior art semiconductor device of FIG. 1, the lengths of the bonding wires 210 and 210' in the device of FIG. 2 may be reduced and hence the inductance between the common electrode of the semiconductor chip 108 and the common leads 107 and/or 107' is reduced considerably with the aid of the low inductance in the bridge conductor 212. The bridge conductor 212, however, cannot be positioned above the space between the metallized layers 102 and 103 due to the difficulty in the bonding process of the wire 104, and thus the radiation electric field is not shielded between the input and output metallized layers 102 and 103. Therefore, the stray capacitance between the input and output metallized layers 102 and 103 is still observed to a large extent. There is thus a significant amount of leakage of input power to the output side as a results of the stray capacitance, which causes a reduction in the the power gain of the device. In addition, the resulting feedback of the output signal to the input signal renders the operation of the device unstable.

Further, in the event a thermoplastic resin is used for the sealing member 111 in a manner such that the resin is molded on the semiconductor chip so as to hermetically seal the latter, upon molding resin thereon, an unwanted pressure acts on the chip 108 and the bonding wires 109, 110, 210, etc., thus deteriorating the electric characteristic of the chip 108 or leading to cutting or shortcircuiting of the bonding wires 109, 110, 210, etc.

The disadvantages of these prior art semiconductor devices are substantially overcome by the present invention of which first and second embodiments are now described in detail with reference to FIGS. 3 and 4.

Figure 3:
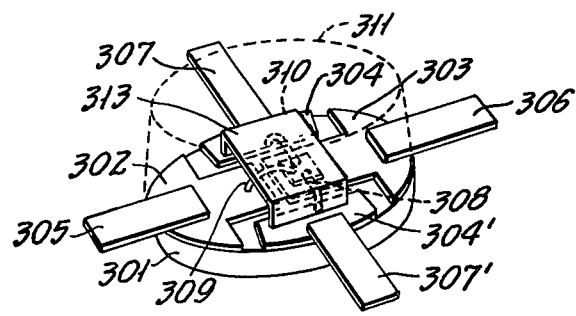
FIG. 3 is a perspective view of a semiconductor device according to a first embodiment of the present invention.

The first embodiment of the invention shown in FIG. 3 is an improvement over to the prior art semiconductor device of FIG. 1. Thus, as shown in FIG. 3, an input-terminal metallized layer 302 and an output-terminal metallized layer 303 are formed in opposed relation to each other on an insulator substrate 301 which is made of beryllia, alumina or the like as in the case of the prior art semiconductor device. Common-terminal metallized layers 304, 304' are formed on the opposite sides of the input and output-terminal metallized layer 302 and 303. An input lead 305 and an output lead 306 are bonded to the input-terminal metallized layer 302 and output-terminal metallized layer 303, and common leads 307 and 307' are bonded to the common-terminal metallized layers 304 and 304'. The semiconductor chip 308 which may be a transistor, integrated circuit or the like is bonded to the output-terminal metallized layer 303. The input electrode or base electrode of the semiconductor chip is connected to the input-terminal metallized layer 302 by a bonding wire 309 and the common or emitter electrode is connected to the common-terminal metallized layers 304 and 304' by bonding wires 310 and 310'. Both side portions of an input and output shielding conductor 313 are bonded to the common-terminal metallized layers 304 and 304' in a manner such that the upper portion of the shielding conductor covers the semiconductor chip 308 and bonding wires 309, 310 and 310' from above and also covers the space between the input-terminal metallized layer 302 and the output-terminal metallized layer 303. A sealing member 311 seals the semiconductor chip 308 and other components on the insulator substrate 301, with resin molded thereon or a ceramic package.

With this arrangement, the radiation electric field of the input signal and the output signal is shielded by the input and output shielding conductor 313, and the electric field in the neighborhood of the semiconductor chip 308 is fixed, thereby minimizing the effective stray capacitance between the input and output-terminal metallized layers 302 and 303. As a result, the input and output signals can be separated from each other in the semiconductor device, thereby preventing the feedback of the output signal to the input signal and the leakage of input power to the output side, which improves the power gain of the semiconductor device. In addition, oscillation due to leakage or feedback can be prevented, and thus stable operation of the semiconductor device can be achieved. Since the interaction of the input and output signals, may become more serious at higher operating frequencies. The semiconductor device shown in FIG. 3 effectively prevents this interaction, especially in the high frequency range, thus improving the power gain and other characteristics of the device in the high-frequency band. Still furthermore, when the semiconductor chip 308 and other components on the insulator substrate 301 are sealed with the sealing member 311 in a manner that the thermoplastic resin is molded, the input and output shielding conductor 313 serves as the buffer means against the pressure of the molding resin, so that a pressure acting on the chip 308 and bonding wires 309, 310 and 310' is moderated, with the result that the electric characteristic of the chip 308 is not impaired and the cutting and short circuiting of bonding wires 309, 310 and 310' is prevented.

Figure 4:
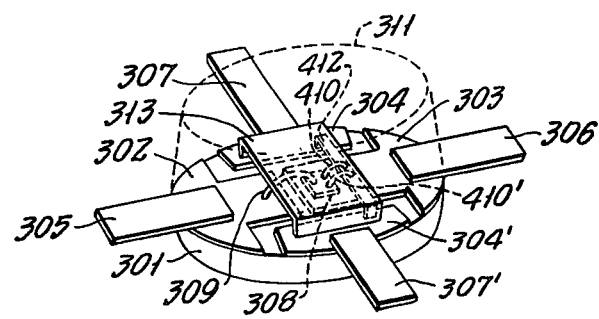
FIG. 4 is a perspective view of a semiconductor device according to a second embodiment of the invention.

FIG. 4, illustrates a semiconductor device according to a second embodiment of the invention, which is similar in its essential parts to that of the embodiment of FIG. 3. Thus, like parts in the embodiment of FIG. 4 are designated by like reference numerals in common with the first embodiment. In the second embodiment of the invention as illustrated in FIG. 4, a bridge metallic conductor 412 is additionally attached so as to short circuit the common-terminal metallized layers 304 and 304'. This bridge conductor 412 is electrically connected to a common electrode of the semiconductor chip 308 (an emitter, if the chip 308 is a transistor) by bonding wires 410 and 410'. A shielding conductor 313 covers the tip of the input-terminal metallized layer 302 and the semiconductor chip 308. In the event the sealing member 311 is formed by molding resin, the shielding conductor 313 is arranged to also cover the bridge metallic conductor 412.

As in the first embodiment of FIG. 3, the second embodiment of FIG. 4 effectively prevents the interaction of input and output signals by means of the shielding conductor 313, thereby providing improved power gain as well as stable operation for the semiconductor device. Moreover, the second embodiment has a further reduction of the inductance between the common or base electrode and the output leads 307 and/or 307' due to the short bonding wires 410 and 410' and the low inductance of the bridge metallic conductor 412, resulting in further improved power gain as well as stabilized operation for the semiconductor device.

While a description has been thus far given of preferred embodiments of the invention, it will be understood that the sealing member is not necessarily limited to the thermoplastic resin which is molded, but may also be, for example a ceramic package or a metal can package. The conventional semiconductor device sealed by a metal can package is occasionally used under the condition that the can package is grounded. In this case, however, little electrostatic shielding results between the input and output-terminal metallized layers the tips of which are positioned closely to each other on the insulator substrate, because the electric field in the neighborhood of the tips of the input and output-terminal metallized layers is not fixed sufficiently. Therefore, the separate provision of a shielding conductor as in the present invention may well provide electrostatic shielding. From the viewpoint of electrostatic shielding, it is preferable that an area of a portion to be covered with the shielding conductor be increased. However, if the area is too wide, then the capacitances between the leads are increased, thus impairing the power gain and high frequency characteristic of the device. Accordingly, the extent of coverage of the shielding conductor should be such as to cover only the space between the input and output terminal metallized layers as well as the semiconductor chip. Particularly, if the sealing member is made by molding resin, the extent of coverage of the shielding conductor should also cover the bonding wires. In addition, the configuration of the shielding conductor need not be limited to a plate form, but may also be a mesh form, with the same result. Each of the common-terminal metallized layer and the common leads may be arranged to be a single element, with the same shielding effect. Due to this shielding effect, a gain increment for the device will be expected to some extent. However, this arrangement will increase the inductance from the common or emitter electrode to the common lead and impair the power gain. Therefore, for use in a circuit requiring high gain, it is preferable to arrange each of the common-terminal metallized layer and the common lead to be separate elements as described above.

What is claimed is:

1. A semiconductor device comprising:
an insulator substrate having a major surface;
first, second and third metal layers disposed on said major surface of said insulator substrate and mutually separated from each other, said first metal layer serving as an input terminal, said second metal layer serving as an output terminal, and said third metal layer serving as a common terminal;
a semiconductor chip having a bottom surface and an upper surface and bonded at said bottom surface on said second metal layer, the upper surface of said semiconductor chip including an input electrode and a common electrode.
a first bonding wire connected at one end to said first metal layer and at its other end to said input electrode of said semiconductor chip;
a second bonding wire connected at one end to said third metal layer and at its other end to said common electrode of said semiconductor chip;
a piece of conductive metal covering said first and second bonding wires, said semiconductor chip, and the smallest space between said first and second metal layers;
a supporting member mechanically supporting said piece of conductive metal in a manner such that said piece of conductive metal is spaced from said bonding wires and from said semiconductor chip;
means for supplying a fixed potential to said piece of conductive metal; and
a molded resin enclosing said piece of conductive metal, said semiconductor chip, and said bonding wires and attached to said piece of conductive metal and to at least a portion of said major surface of said insulator substrate.

2. The semiconductor device as set forth in claim 1, in which said supporting member is mechanically and electrically connected to said piece of conductive metal and to said third metal layer.

3. The semiconductor device as set forth in claim 1, in which said first metal layer and said second metal layer are formed substantially in a line and the smallest space between said first and second metal layers exists on said line.

4. The semiconductor device as set forth in claim 1, further comprising first, second, and third external leads having end portions respectively mechanically and electrically connected to said first, second, and third metal layers, said end portions of said external leads being enclosed with said molded resin.

5. The semiconductor device as set forth in claim 1, in which an output electrode is formed on said bottom surface of said semiconductor chip and mechanically and electrically connected to said second metal layer.

6. A semiconductor device comprising:
an insulator substrate having a major surface;
first, second, third, and fourth metal layers disposed on said major surface of said insulator substrate and mutually separated from each other, said first and second metal layers being formed substantially in a line, said third and fourth metal layers being disposed on opposite sides of said line, said first metal layer serving as an input terminal, said second metal layer serving as an output terminal, and said third and fourth metal layers serving as common terminals.
a semiconductor chip having a bottom surface and an upper surface and bonded at said bottom surface onto said second metal layer, said semiconductor chip having an input and a common electrode at said upper surface, a smallest space being formed on said major surface of said insulator substrate between said first metal layer and said semiconductor chip;
a conductive bridge member bridging from said third metal layer to said fourth metal layer across said line and mechanically and electrically connected to said third and fourth metal layers, said bridge member being separated from said first and second metal layers;
a first bonding wire connected at one end to said first metal layer and at its other end to said input electrode of said semiconductor chip, and separated from said major surface under said smallest space across said smallest space;
a second bonding wire connected at one end to said bridge member and at its other end to said common electrode of said semiconductor chip;
a shielding metal plate covering said first and second bonding wires, said semiconductor chip, said bridge member, and said smallest space on said major surface of said insulator substrate;
means for supplying said shielding metal plate with a voltage of a fixed potential;
a first supporting member mechanically and electrically connected to said shielding metal plate and to said third metal layer and supporting said shielding metal plate in a manner such that said shielding metal plate is spaced from said bonding wires, from said semiconductor chip, from said bridge member, and from said smallest space;

means for electrically connecting said fourth metal layer to said shielding metal plate;

first, second, third, and fourth external metal leads mechanically and electrically connected at their peripheral portions to said first, second, third, and fourth metal layers, respectively;

a molded resin enclosing said shielding metal plate, said bonding wires, said semiconductor chip, and said peripheral portions of said first, second, third, and fourth external metal leads, and attached to said shielding metal plate and to at least a portion of said major surface of said insulator substrate.

7. The semiconductor device as set forth in claim 6, in which an output electrode is formed on said bottom surface of said semiconductor chip, and mechanically and electrically connected to said second metal layer.

8. A semiconductor device comprising:

an insulator base plate having a major surface;

base, collector, and emitter metal layers disposed on said major surface and mutually separated from each other, said base and collector metal layers being formed substantially in a line, said base metal layer serving as an input terminal, said collector metal layer serving as an output terminal, and said emitter metal layer serving as a common terminal;

a transistor element having base and emitter electrodes at its upper surface and a collector electrode at its bottom surface, said collector electrode being mechanically and electrically connected to said collector metal layer;

a collector coupling wire connected at one end to said base metal layer and at its other end to said base electrode of said transistor element across a space between said base metal layer and said collector metal layer, and separated from said major surface between said base and collector metal layers;

an emitter coupling wire electrically coupling said emitter metal layer to said emitter electrode of said transistor element.

a metal plate covering said emitter and collector coupling wires, said transistor element, and said space without mechanically touching them;

a supporting metal connected at one end to said emitter metal layer and at its other end to said metal plate, and supporting said metal plate in a manner such that said metal plate is separated from said bonding wires and from said transistor element;

base, emitter, and collector external leads mechanically and electrically connected at one end portion to said base, emitter, and collector metal layers, respectively; and a molded resin encapsulating said metal plate, said transistor element, and said coupling wires and adhering to said metal plate and to at least one part of said major surface of said base plate.

9. The semiconductor device as set forth in claim 8, in which said emitter coupling wire is electrically and mechanically connected at one end to said emitter metal layer and at its other end to said emitter electrode of said transistor element.

10. The semiconductor device as set forth in claim 8, further comprising a collector electrode at said bottom surface of said transistor element, and means for electrically and mechanically connecting said collector electrode to said collector metal layer.

11. The semiconductor device as set forth in claim 8, wherein said emitter metal layer includes first and second parts positioned on opposite sides of said line formed by said base and collector metal layers.

12. The semiconductor device as set forth in claim 11, further comprising an electrical coupling bridge mechanically and electrically connected to said first and second parts of said emitter metal layer, and a bonding wire connected at one end to said emitter electrode of said transistor element and at its other end to said coupling bridge.

* * * * *